United States Patent [19]

Hinshaw

[11] 4,184,110

[45] Jan. 15, 1980

[54] INVESTIGATION OF SAMPLES BY N.M.R. TECHNIQUES

[75] Inventor: Waldo S. Hinshaw, Wembley, England

[73] Assignee: National Research Development Corporation, London, United Kingdom

[21] Appl. No.: 909,186

[22] Filed: May 24, 1978

[30] Foreign Application Priority Data

May 27, 1977 [GB] United Kingdom ............... 22523/77

[51] Int. Cl.$^2$ ............................................. G01R 33/08
[52] U.S. Cl. ................................. 324/0.5 R; 324/313
[58] Field of Search ......... 324/0.5 R, 0.5 MA, 0.5 H, 324/0.5 A, 0.5 AC

[56] References Cited

U.S. PATENT DOCUMENTS

| 3,530,371 | 9/1970 | Nelson et al. ................... 324/0.5 R |
| 3,789,832 | 2/1974 | Damadian ......................... 324/0.5 R |
| 4,015,196 | 3/1977 | Moore et al. ..................... 324/0.5 R |

*Primary Examiner*—M. Tokar
*Attorney, Agent, or Firm*—Cushman, Darby & Cushman

[57] ABSTRACT

Nuclear magnetic resonance is excited in a sample subjected a magnetic field having a varying component which defines a localized volume approximating to a line or surface, the field within the localized volume being invariant with time but exhibiting a spatial gradient. The r.f. irradiation is in the form of a pulse train such that the signal received from the sample contains continuous wave components respectively dependent on the density of relevant nuclei in different regions of the localized volume. The amplitudes of these components are determined by coherently detecting the received signal, sampling the detected signal(s) and subjecting the resultant data to Fourier transformation.

8 Claims, 5 Drawing Figures

INVESTIGATION OF SAMPLES BY N.M.R. TECHNIQUES

This investigation relates to the investigation of samples by means of nuclear magnetic resonance (N.M.R.) techniques.

In conventional experiments using such techniques the results obtained relate to the average properties of a sample under investigation, but in recent times considerable attention has been directed to methods by means of which the properties of different parts of a sample may be individually distinguished, thereby making it possible to obtain information relating to the distribution within an inhomogeneous sample of the values of parameters such as nuclear spin density and nuclear spin relaxation time. One type of method suitable for this purpose is disclosed for example in British patent specification No. 1,508,438 and U.S. Patent No. 4,015,196; further details of certain methods of this type are disclosed in a paper by the present inventor published in Journal of Applied Physics, Vol. 47, pages 3709/21. In this type of method nuclear magnetic resonance is caused to occur in a sample under investigation by irradiating the sample with radio frequency energy while subjecting it to a magnetic field having a systematically varying non-homogeneous component such that the field is substantially invariant with time in a localised volume of the sample but varies with time in all other parts of the sample; information relating to N.M.R. effects specific to the localised volume can then be derived from signals received from the sample resulting from the magnetic resonance.

In methods of the type referred to, the localised volume may be caused to approximate to a point, a line (which will normally be straight) or a surface (which will normally be planar), i.e., it may be localised respectively in three dimensions, two dimensions or one dimension. In the last of these cases the varying component of the magnetic field is arranged to have zero value in the relevant surface, while in the other two cases the varying component comprises two or three sub-components having different time dependences and arranged to have zero value in different surfaces (which will normally be orthogonal planes) which intersect respectively at the relevant line or point. In the aforesaid documents the case discussed in most detail is that in which the localised volume approximates to a point, but this has the disadvantage of requiring a relatively long time for the investigation of the spatial distribution in the sample of a parameter of interest, since information is obtained from the sample for only one point at a time.

It is therefore an object of the present invention to provide a method of investigating a sample which is improved in that respect.

In a method according to the invention nuclear magnetic resonance of a given nuclear species is caused to occur in a sample under investigation by irradiating it with radio frequency energy while subjecting it to a magnetic field, the magnetic field having a systematically varying non-homogeneous component such that the field is substantially invariant with time in a localised volume of the sample but varies with time in all other parts of the sample, said localised volume approximating to a line or surface extending parallel to a given direction and the magnetic field also having a static non-homogeneous component such that within at least part of the localised volume the field, and hence also the resonance frequency for said given species, varies monotonically (preferably linearly) with distance in said given direction; the radio frequency energy is in the form of a train of regularly recurring pulses which are short compared with the intervals between them and which are constituted by intense bursts of oscillation of the same frequency (preferably so-called 90° pulses), characteristics of the pulse train being such that at least part of the frequency spectrum of the radio frequency energy corresponds to at least part of the range of resonance frequencies for said given species within said at least part of localised volume, that the intervals between the pulses are short compared with the spin-spin relaxation times for at least some of the nuclei of said given species present in the sample, and that in said other parts of the sample there is a significant change between consecutive ones of said intervals in the average value of the magnetic field during one such interval. A signal resulting from the nuclear magnetic resonance is received from the sample, this signal containing, by virtue of the manner in which the resonance is caused to occur, substantially continuous wave components whose respective amplitudes are dependent on the amounts of revelant nuclei present in different regions of the localised volume distributed along said given direction; where the localised volume approximates to a line these regions will approximate to points on the line, and where the localised volume approximates to a surface these regions will approximate to lines in the surface extending perpendicular to said given direction. The received signal is subjected to coherent detection to produce at least one detected signal, and the or each detected signal is sampled during at least one interval between the pulses for each of a series of consecutive equal sub-intervals of that interval (preferably by deriving the integrated value of the signal over each sub-interval), the sampling frequency being sufficiently high to enable information regarding the respective amplitudes of said components of the received signal to be derived by subjecting the data obtained by means of the sampling to appropriate processing involving Fourier transformation.

It may be noted that in a method according to the invention the frequency spectrum of the irradiating energy is centred at the frequency of said oscillation and consists of a series of components spaced apart by intervals equal to the recurrence frequency of the pulses; the effective width of the spectrum is of course inversely dependent on the duration of the individual pulses. The components of the received signal referred to in the preceding paragraph constitute a series of sidebands respectively occupying frequency ranges which lie between the frequencies of adjacent pairs of components of the irradiation spectrum, the total frequency span of these components corresponding to said at least part of said range of resonance frequencies. Having regard to these considerations, it will be appreciated that the choice of the frequency of said oscillation and of the sampling frequency will depend upon the nature of the system employed for coherent detection of the received signal. Such detection may be effected using a single phase-sensitive detector, but it will normally be preferred to employ the phase quadrature detection system. Thus where a single phase-sensitive detector is used the frequency of said oscillation must be located outside said at least part of said range of resonance frequencies, and the minimum possible value of the sampling frequency that can be used is then equal to twice the width of the total frequency span of said components of the received signal; where the phase quadrature detection system is used, however, the frequency of said oscillation can be located within said at least part of said range of resonance frequencies, and in this case the minimum possible value of the sampling frequency that can be used is equal to the width of the total frequency span of said components of the received signal.

When using methods according to the invention it is found that with certain types of sample the only significant components in the received signal are those arising from the resonance effects in the localised volume. It would appear that this can be explained on the basis that in such cases only a small proportion of the nuclei of the relevant species present in the sample have spin-lattice relaxation times shorter than the intervals between the pulses, as a result of which a saturation effect occurs in the parts of the sample other than the localised volume, the occurrence of a steady state effect in those parts of the sample being prevented by the change in the magnetic field between consecutive ones of the intervals between the pulses. In other cases, however, the received signal will also contain significant components arising from resonance effects in the parts of the sample other than the localised volume, and it is then necessary to adopt additional measures to ensure that the presence of these components does not substantially contaminate the information derived by the processing of the data obtained by means of the sampling of the detected signal(s). In particular these data must be obtained on a time-averaging basis (such as would in any event be appropriate for the improvement of signal-to-noise ratio), the sampling of the or each detected signal being carried out over a series of consecutive intervals between the pulses and the average value of the samples for each set of corresponding sub-intervals being separately derived; in order to minimise the effects of contributions to the received signal arising from parts of the sample other than the localised volume, the averaging should be effected over a number of periods of the systematic variation(s) of the varying component of the magnetic field which is either integral or much larger than unity.

It should be noted that the desired information regarding the amplitudes of the continuous wave components of the received signal could in some cases be contaminated by virtue of the presence in the received signal of transient components, having time constants shorter than the intervals between the pulses, arising from the presence in the sample of nuclei of the revelant species having very short spin-lattice relaxation times; while the effects of such transient components cannot be completely eliminated by the averaging technique, they can if necessary be greatly reduced by the adoption of appropriate techniques in the processing of the data obtained from the detected signal(s). This may be particularly relevant in the case of samples in which the nuclei of the relevant species exhibit a wide range of relaxation times, where it may not be practicable to make the intervals between the pulses short enough to ensure that the received signal contains no significant transient components of the kind in question.

The bursts of oscillation in the pulse train may all have the same phase, in which case the components of the irradiation spectrum will have frequencies given by the expression $F \pm kf$, where F is the frequency of the oscillation, f is the recurrence frequency of the pulses, and k has the values 0,1,2 etc. Where the averaging technique is used, however, a better arrangement is to cause the bursts to alternate in phase by 180°, since this alleviates certain problems relating to baseline drift and noise; in this case the components of the irradiation spectrum will have frequencies given by the expression $F \pm (k + \frac{1}{2})f$. It should be noted that with this arrangement the sign of the received signal will reverse after each pulse, and this must be taken into account in the averaging process.

It will be appreciated that with a method according to the invention it is possible to obtain from the sample information for many points at a time. For any given localised volume, the efficiency of data collection can be very high because the received signal is available for analysis for a very high proportion of the duration of the pulse train; in this respect a method according to the invention compares favourably with conventional pulse Fourier transform N.M.R. techniques which involve recording of the free induction decay after each pulse. These features are however achieved without any requirement for excessive complexity in the signal detection system.

By repeated applications of a method according to the invention in respect of the same sample, with an appropriate alteration of the conditions on each occasion, it is of course possible to derive information regarding the distribution throughout the sample, or a selected part of the sample, of the nuclei of interest. Thus where the localised volume approximates to a straight line, it can be shifted relative to the sample in a direction perpendicular to its length between successive applications of the method to derive information relating to the relevant distribution in a section of the sample, this information being in a form suitable for display as a two-dimensional image; if desired the whole process can be repeated for different sections of the sample. Where the localised volume approximates to a planar surface, one possibility is to shift the surface in a direction perpendicular to itself relative to the sample between successive applications of the method, without changing the orientation of said given direction relative to the sample; this will provide information from which can be derived a two-dimensional shadow image, i.e., an image of the relevant distribution in the sample projected in a direction perpendicular to said given direction. Another possibility is to change the orientation of said given directions relative to the sample between successive applications of the method, without changing the position of the planar surface in the sample; one can then obtain a series of one-dimensional shadow images projected in different directions all parallel to the surface, from which a two-dimensional image of the relevant distribution in a section of the sample corresponding to the surface can be reconstructed by known techniques.

An embodiment of the invention will now be described by way of example with reference to the accompanying drawings, in which.

Figure 1:
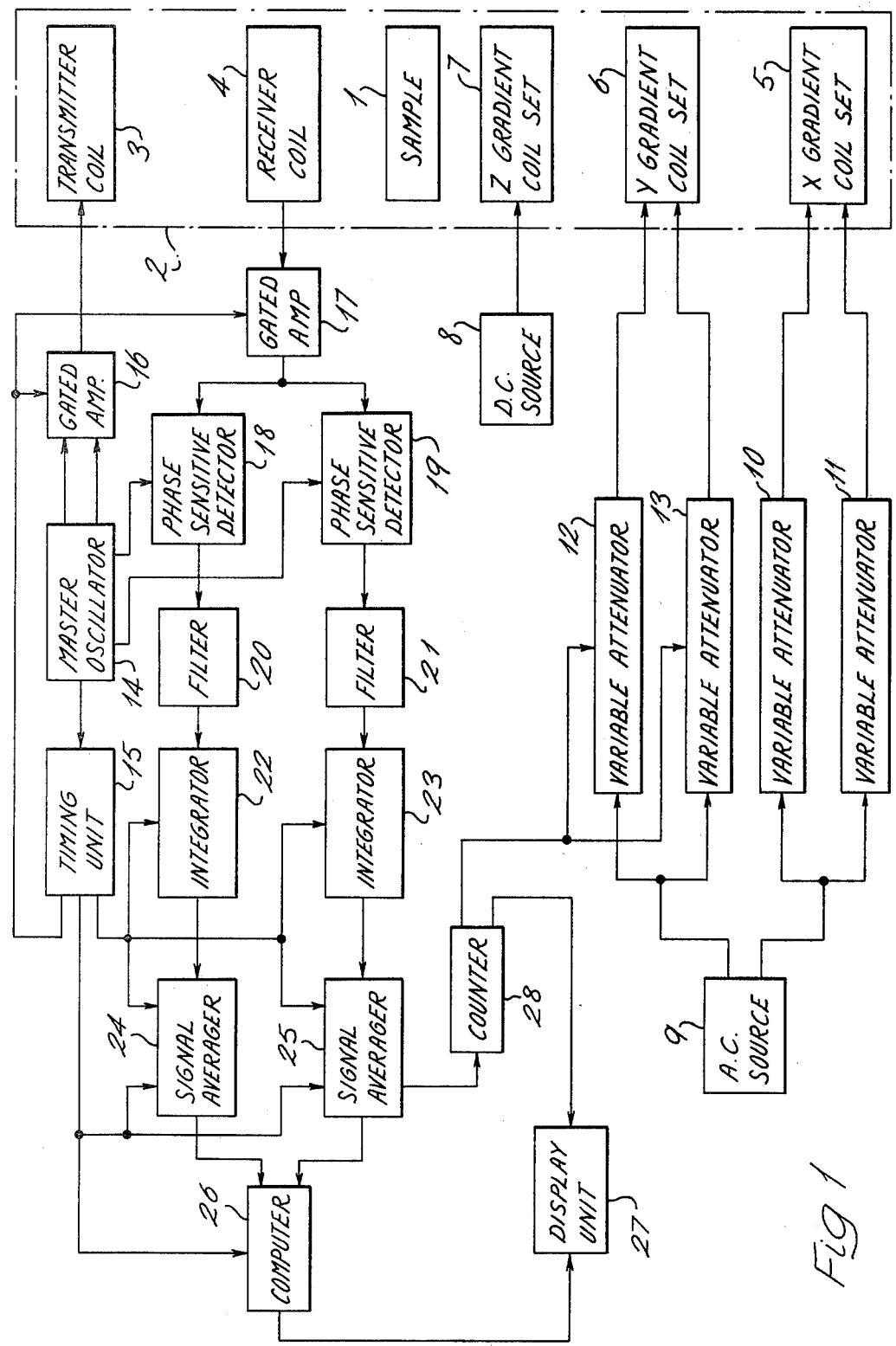
FIG. 1 is a diagrammatic representation of a N.M.R. imaging system employing the principles of the invention.
Figure 2:
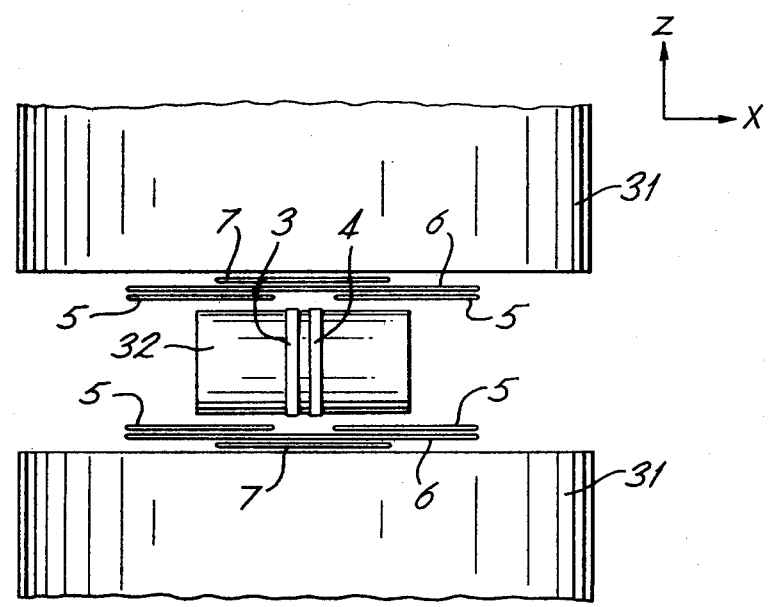
FIG. 2 is a view of part of the structure of the system illustrated in FIG. 1.

As indicated in FIG. 1, in the system to be described a sample 1 under investigation is located within a coil assembly (generally designated 2) which is disposed in an intense uniform magnetic field generated by a conventional electromagnet (not indicated in FIG. 1). The assembly 2 comprises a conventional transmitter coil 3 by means of which the sample 1 may be irradiated with radio frequency energy, and a conventional receiver coil 4 for picking up N.M.R. signals from the sample 1. The assembly 2 also comprises three gradient coil sets 5, 6 and 7 for subjecting the sample 1 to non-homogeneous magnetic fields which are superimposed on the main field generated by the magnet. The general structural arrangement of the coils 3 and 4 and the coil sets 5, 6 and 7 is shown in FIG. 2 and the individual layouts of the coil sets 5, 6 and 7 are illustrated respectively in FIGS. 3a, 3b and 3c. Referring to FIG. 2, the main field is established in the air gap between the pole pieces 31 of the electromagnet, and the sample 1 (which is not visible in FIG. 2) is located substantially centrally in the air gap within a tubular container 32 of non-magnetic insulating material. The coils 3 and 4 are wound on the outside of the container 32, whose axis extends perpendicular to the direction of the main field. Each of the coil sets 5, 6 and 7 has parts lying substantially in planes perpendicular to the direction of the main field and respectively located close to the faces of the pole pieces 31.

Figure 3C:
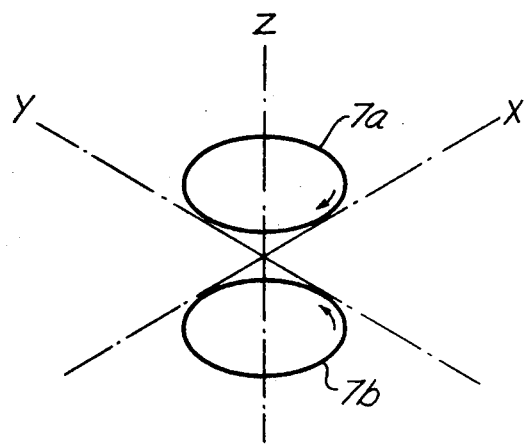
FIGS. 3a, 3b and 3c are diagrams illustrating the layouts of three coil sets used in the imaging system.
Figure 3A:
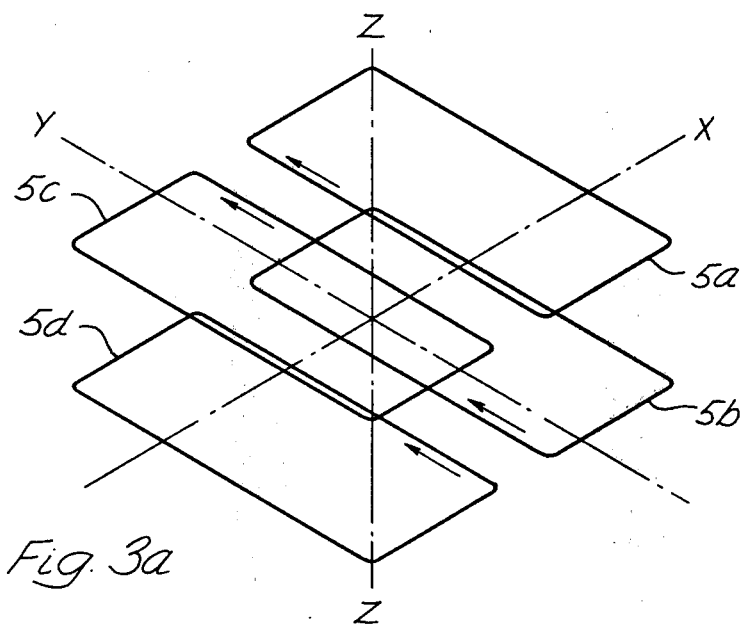
Figure 3B:
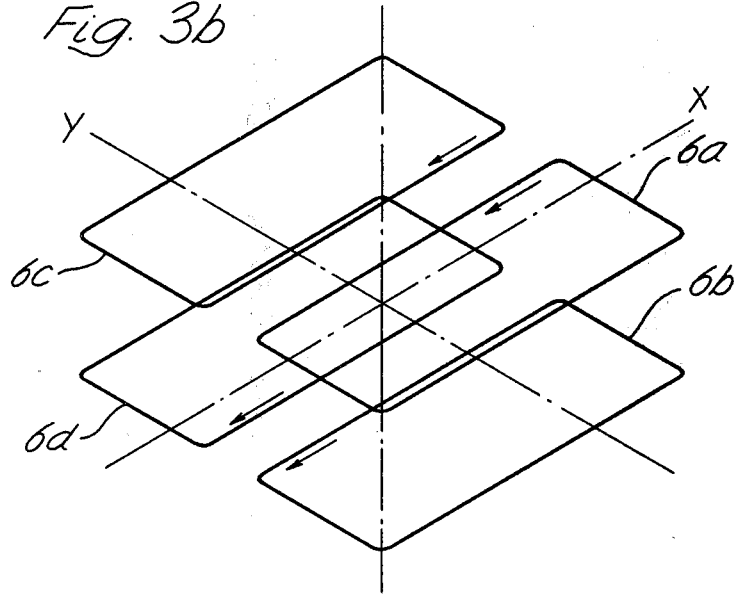

The arrangement of the coil sets 5, 6 and 7 will be more readily understood by reference to FIGS. 3a, 3b and 3c, and in describing this arrangement it is convenient to refer to a Cartesian co-ordinate system having its origin at the centre of the air gap and its Z axis corresponding to the direction of the main field. The coil sets 5, 6 and 7 are designed so that in the vicinity of the origin the field generated by each of them will have a vector component parallel to the Z axis, this component having an intensity which varies monotonically with position parallel to one of the axes (X, Y and Z respectively for the coil sets 5, 6 and 7) but does not vary with position parallel to the other two axes; in other words the non-homogeneous fields generated by the coil sets 5, 6 and 7 respectively exhibit gradients in three mutually perpendicular directions parallel to the X, Y and Z axes. Thus, the coil sets 5 consists of four similar rectangular coils 5a, 5b, 5c and 5d, all extending perpendicular to the Z axis with their longer sides parallel to the Y axis, the arrangement being such that none of the coils intersects the plane X=0, that the coil 5a is a mirror image of the coil 5b with respect to the plane Z=0 is a mirror image of the coil 5c with respect to the plane X=0, and that the coil 5d is a mirror image of the coil 5b with respect to the plane X=0 and is a mirror image of the coil 5c with respect to the plane Z=0. The coils 5a and 5b are connected in series to constitute one half of the coil set 5, and the coils 5c and 5d are connected in series to constitute the other half of that set, the coils being energised in such a way that currents will flow in the same sense through those longer sides of all four coils which are disposed closer to the plane X=0. The coil 6 is similar to the coil set 5 but with the co-ordinates X and Y interchanged. The coil set 7 is in the form of a Helmholtz pair wound in opposition, the coils 7a and 7b of this set being disposed substantially in planes perpendicular to the Z axis with their centres lying on that axis, these planes being equidistant from the plane Z=0.

The coil sets 5 and 6 are energised by alternating currents so that each generates a varying magnetic field, with the time dependences being different for the two fields. A convenient arrangement in this respect is to use sinusoidal currents of the same frequency for both of the coil sets 5 and 6 but with a phase difference of 90° between the currents for the two sets; in the subsequent description it is assumed that this arrangement is used. The design of the coil set 5 is such that the strength of the field which it generates is zero throughout a plane perpendicular to the X axis, the position of this plane along the X axis being determined by the relative magnitudes of the currents respectively flowing through the two halves of the coil set 5; a similar consideration applies to the coil set 6, but with the X axis replaced by the Y axis. The resultant of the fields generated by the coil sets 5 and 6 is thus zero along a line (subsequently referred to as the sensitive line) parallel to the Z axis. The coil set 7 is energised by direct current, so that it generates a magnetic field which is invariant with time, and its design is such that this field exhibits throughout the sample 1 a uniform gradient (whose magnitude is subsequently denoted by G) in the direction of the Z axis.

It will be appreciated that with this arrangement the total magnetic field strength is substantially invariant with time in a localised volume of the sample 1 approximating to the part of the sensitive line within the sample 1, but varies significantly with time at all points in the sample 1 outside this localised volume. The dimensions of the localised volume perpendicular to the Z axis will vary inversely with the magnitudes of the gradients exhibited by the fields generated by the coil sets 5 and 6, and these magnitudes will be chosen in accordance with the desired degree of resolution for the imaging process; in typical applications they may have a value of the order of one gauss per cm. Within the localised volume the total field strength of course varies linearly with distance parallel to the Z axis. In the absence of the fields generated by the coil sets 5 and 6 the magnetic field strength would of course be constant over any plane perpendicular to the Z axis and in particular in the plane Z=0 it would be simply equal to the strength of the main field generated by the magnet. If the strength of the main field is denoted by H, it will thus be seen that for any point in the localised volume the total field strength is given by the expression H+GL, where L (which may be positive or negative) denotes the distance of that point from the plane Z=0.

It will be noted that in the system being described the sensitive line extends parallel to the direction of the main magnetic field. In alternative systems it would be possible to arrange for the sensitive line to have any desired orientation relative to the main field, but the arrangement described is preferred because of its relative simplicity. It should also be noted that, although for the sake of definiteness the container 32 is shown in FIG. 2 as having its axis lying along the X axis, it could instead (without altering the principles of operation of the system) have this axis orientated in any other direction perpendicular to the direction of the main field.

Referring again to FIG. 1, the current for the coil set 7 is derived from a d.c. source 8, while the currents for the coil sets 5 and 6 are derived from an a.c. source 9 which provides two outputs having the required phase quadrature relationship. The currents for the two halves of the coil set 5 are derived from one of these outputs respectively via a pair of differentially variable attenuators 10 and 11, the setting of which determines the X co-ordinate of the sensitive line; for any one imaging process this setting is maintained fixed, so that the imaging relates to a thin section of the sample 1 extending perpendicular to the X axis, but if desired successive imaging processes can be effected for different sections of the sample 1 by varying the setting of the attenuators 10 and 11. The currents for the two halves of the coil set 6 are derived from the other output of the source 9 respectively via a pair of differentially variable attenuators 12 and 13, the setting of which determines the Y co-ordinate of the sensitive line; as will be explained further below, during each imaging process this setting is varied in stepwise fashion so as to effect a line by line scan of the relevant section of the sample 1.

The r.f. energy for irradiating the sample 1 is derived from a master oscillator 14 having a frequency equal to the nuclear magnetic resonance frequency (for nuclei of the species to be observed) corresponding to a magnetic field of strength H. When using proton resonance, this frequency could typically have a value of about 30 Mhz, which would correspond to H being of the order of seven kilogauss. An output from the oscillator 14 is fed to a timing unit 15, which generates various timing signals used in the system in response to counting of the cycles of the oscillation. Two further outputs from the oscillator 14, of equal amplitude but of opposite phases, are fed to two inputs of a gated amplifier 16 which is controlled by signals from the timing unit 15, the amplifier 16 being turned on, with the inputs alternately operative, for periods of short duration (subsequently denoted by T) separated by intervals of duration 127T; the output of the amplifier 16 is thus in the form of a train of regularly recurring pulses constituted by bursts of oscillation which alternate in phase by 180°, the pulse repetition period having a duration of 128T (subsequently denoted by R). The output from the amplifier 16 is fed to the transmitter coil 3, and the characteristics of the amplifier 16 and the coil 3 are designed so that each pulse gives rise to a rotation of the nuclear magnetisation in the sample 1 of the order of 90°. For a given sample, the value of T must of course be made such as to ensure that the intervals between the pulses are short compared with the spin-spin relaxation times for at least some of the nuclei of the relevant species present in the sample; in many cases, for example when using proton resonance in biological materials, T may suitably have a value of the order of 10 microseconds, when R will have a value somewhat greater than one millisecond and the pulse recurrence frequency will have a value somewhat less than one khz. Further, for a given value of T the frequency of the alternating currents generated by the source 9 must be chosen so that in the parts of the sample 1 other than the localised volume there is a significant change between consecutive ones of the intervals between the pulses in the average value of the magnetic field during one such interval; this implies that there should not be synchronism or a low order harmonic relationship between the pulse recurrence frequency and the frequency of the alternating currents generated by the source 9, i.e., R and P should not be so related that one is a small integral multiple of the other, where P denotes the duration of one period of the alternating currents generated by the source 9. These currents may suitably have a frequency of about 70 hz when T has a value of 10 microseconds.

The frequency spectrum of the irradiating r.f. energy will thus be centred on the frequency of the oscillator 14 and will comprise a series of components spaced apart by intervals equal to the pulse recurrence frequency. The value of G is chosen to be sufficiently large to ensure that during the scanning of the sensitive line through the sample 1 there will never be more than 128 of these components within the range of resonance frequencies corresponding to the range of magnetic field strengths along the length of the localised volume. As an example, consider the case of proton resonance in a sample 1 shaped such that the possible range of values for L is from $-5$ to $+5$ cms; in this case G must have a value of somewhat more than two gauss per cm if T has a value of 10 microseconds. It may be noted here that if T has this value the envelope of the irradiation spectrum will be relatively flat over the frequency range corresponding to the central 128 components of this spectrum.

The N.M.R. signal picked up by the coil 4 (which as indicated above contains a series of sidebands whose respective amplitudes depend on the amounts of relevant nuclei present in different regions of the localised volume approximating to points spaced along the sensitive line) is fed to a gated amplifier 17 which is turned off during each r.f. pulse, by means of signals derived from the timing unit 15, in order to block off undesired feed through of the r.f. signal from the coil 3. The output of the amplifier 17 is applied to two identical phase-sensitive detectors 18 and 19, reference signals for which are derived from the oscillator 14; these reference signals differ in phase by 90°. The outputs of the detectors 18 and 19 are respectively fed via identical lowpass filters 20 and 21 to two identical resettable integrators 22 and 23, the filters 20 and 21 being designed to eliminate noise at frequencies above the range corresponding to the sidebands in the signal picked up by the coil 4; this range will have a maximum value of 50 khz if T has a value of 10 microseconds. Each of the integrators 22 and 23 incorporates a capacitor which is charged from the input signal applied to the integrator, the capacitor being rapidly discharged to reset the integrator. The integrators 22 and 23 are reset 128 times during each pulse repetition period by means of signals derived from the timing unit 15, so that each such period is divided into 128 consecutive integrating periods each of duration T, the timing of the operation being such that one of these integrating periods is precisely synchronous with the r.f. pulse.

The outputs of the integrators 22 and 23 are applied respectively to a pair of identical signal averagers 24 and 25, whose operation is controlled by means of signals derived from the timing unit 15. Each averager 24 or 25 incorporates a sample-and-hold circuit which is operated just before each resetting of the integrators 22 and 23 to sense the voltage on the capacitor in the corresponding integrator 22 or 23, and an analogue-to-digital converter which produces a digital word representing the value of the sensed voltage. Each averager 24 or 25 also incorporates a memory device having 128 separate memory locations respectively corresponding to the series of 128 integrating periods into which each pulse repetition period is divided, the contents of each memory location being updated once during each pulse repetition period at the time when a digital word is generated for the corresponding one of the integrating periods. For each memory location the updating involves alternate addition and subtraction of the newly generated digital word, in order to take account of the alternation in sign of the signal picked up by the coil 4 which results from the alternation of the phase of the r.f. pulses.

For each different position of the sensitive line during an imaging process, the averaging process effected by the averagers 24 and 25 is continued for a data collection interval having a duration which is not substantially less than the spin-lattice relaxation times of the nuclei to be observed, and which may typically have a value of about one second, this duration being determined by signals generated by the timing unit 15 and corresponding to an integral number of pulse repetition periods. As explained above, in order to minimise the effects of contributions to the signal picked up by the coil 4 arising from parts of the sample 1 other than the localised volume, it may be desirable to make the duration of the data collection interval an integral multiple of the period of the alternating currents generated by the source 9. In such a case, if D denotes the duration of one data collection interval we have D=NP, where N is an integer. It will be appreciated that in the light of this relationship it may be appropriate for the source 9 to be locked in frequency to the oscillator 14. We also have D=MR, where M is an integer, from the relationship just stated in respect of the durations of the data collection interval and the pulse repetition period. As previously stated, R and P should not be so related that one is a small integral multiple of the other; it follows that a similar condition applies to the relationship between N and M in those cases where D=NP. It will be appreciated that there is effectively continuous recording of the signals throughout each data collection interval, although no information from the sample is obtained during (and for a short time after) each r.f. pulse. At the end of each data collection interval the contents of the memory devices in the averagers 24 and 25 are transferred to a digital computer 26, which may be of any conventional type and which is programmed to process the information accumulated during one data collection interval during the next such interval. The memory devices are of course then reset to zero for a further averaging process to be effected. The averagers 24 and 25 should of course be designed so that no incoming information is lost during the transfer of information to the computer 26 and resetting of the memory devices.

Each set of data transferred to the computer 26 is thus in the form of two blocks of 128 digital words, each block representing a series of average values of the output of one of the detectors 18 and 19 for data points distributed uniformly in the time domain throughout the pulse repetition period; the values of the time t for these points are given by $t=0, T, 2T \ldots 127T$, where $t=0$ corresponds to the centre of the duration of the pulse. For each set of data the processing in the computer 26 includes an algorithm which takes account of the loss of information at the beginning of each interval between pulses and which ensures the elimination of any significant contribution to the results which might otherwise occur due to the presence in the sample 1 of nuclei of the relevant species having spin-lattice relaxation times of the same order as or less than the pulse repetition period. This algorithm may suitably consist of multiplying each digital word by the value of the function $(1-\cos \pi t/R)$ for the corresponding value of t. The data processing further includes an algorithm, of a type conventionally used in N.M.R. spectroscopy, to make any necessary adjustments in respect of the signal phases. The data so corrected and adjusted are processed by a standard fast Fourier transform algorithm, the two input data blocks being taken to be the real and imaginary parts of the complex Fourier transform. This produces two output sets of data, one of which consists of a block of 128 digital words corresponding to an absorption mode spectrum of the signal sidebands in terms of discrete frequencies spaced apart by intervals equal to the pulse recurrence frequency. Because of the loss of information during the r.f. pulses, the Fourier transformation does not give the position of the baseline of this spectrum, but this can readily be catered for by arranging that for any position of the sensitive line the range of resonance frequencies within the localised volume will always be sufficiently limited to ensure that there is at least one frequency of the signal sideband spectrum for which it is known that the value of the relevant digital word should be zero; any necessary adjustment of the values of the digital words to conform with this knowledge can of course be made by simple addition or subtraction. It will be appreciated that in order to enable this baseline correction to be effected it may be necessary to choose a value for G rather greater than the minimum indicated above.

It will thus be seen that for each position of the sensitive line the computer 26 will produce a block of 128 digital words whose values represent the respective spin densities, for nuclei of the relevant species having relaxation times lying in a range determined by the choice of the durations of the pulse repetition period and the data collection interval, in regions of the localised volume approximating to a series of points spaced apart at equal intervals along the sensitive line; the position of each word in the block will, of course, correspond with the Z co-ordinate of the relevant point.

The computer 26 has an associated display unit 27 which may suitably be in the form of an oscilloscope incorporating a storage cathode ray tube. For each position of the sensitive line the block of 128 digital words produced by the computer 26 is used to generate on the display unit 27 a rectilinear array of 128 points whose brightnesses are respectively proportional to the values of the digital words. During each imaging process the position of this array is shifted, in a direction perpendicular to its length, by a small amount at the end of each data collection interval, under the control of an output derived from a counter 28. The counter 28 is arranged to count clock pulses, each of which is generated simultaneously with a transfer of data from the averagers 24 and 25 to the computer 26. A further output from the counter 28 is fed to the variable attenuators 12 and 13 so as to bring about a stepwise variation of their setting, and hence of the Y co-ordinate of the sensitive line. There is thus built up line by line on the display unit 27 an image of the distribution of nuclear spin density in the selected section of the sample 1. Each imaging process is initiated by means of a manual control (not shown) which renders the computer 26 and the counter 28 operative and erases any previously formed image from the display unit 27; the process is terminated automatically in response to the receipt of an appropriate number of clock pulses by the counter 28, the computer 26 and the counter 28 then being caused to revert to inoperative states with the counter 28 reset to zero. It will commonly be desired in forming the image to use a number of lines equal to the number of points in each line, in which case the total time for forming the image will be about two minutes where the data collection interval has a duration of about one second.

It should be noted that the system illustrated in the drawing can readily be modified, simply by disconnecting the coil set 5, so as to produce an image of the distribution of nuclear spin density in the sample 1 projected in a direction parallel to the X axis.

When using the phase quadrature detection system some undesirable effects may occur in practice because of the difficulty of precisely matching the two data channels without incurring excessive cost. To counter such effects, it is possible to modify the system described above so that between successive bursts of oscillation there is a phase change of 90° (in the same sense in all cases) instead of 180°. The signal averaging arrangement would then need to be changed somewhat from the arrangement of the averagers 24 and 25 in the system described above. One would again use pairs of sample-and-hold circuits, analogue-to-digital converters and memory devices, but the memory devices would no longer be permanently allocated respectively to the two data channels; instead they would be repeatedly switched between the two channels so that the connections between the memory devices and the channels were reversed for successive pulse repetition periods. Alternate addition and subtraction would still be necessary for correct averaging, but with the changes in sign occurring every two pulse repetition periods for each memory device and with these changes being staggered by one pulse repetition period as between two memory devices.

I claim:

1. A method of investigating a sample, the method comprising:

causing nuclear magnetic resonance of a given nuclear species to occur in said sample by irradiating it with radio frequency energy while subjecting it to a magnetic field, said magnetic field having a systematically varying non-homogeneous component such that said field is substantially invariant with time in a localised volume of said sample but varies with time in all other parts of said sample, said localised volume extending parallel to a given direction and said magnetic field also having a static non-homogeneous component such that within at least part of said localised volume said field, and hence also the resonance frequency for said given species, varies monotonically with distance in said given direction, and said radio frequency energy being in the form of a train of regularly recurring pulses which are short compared with the intervals between them and which are constituted by intense bursts of oscillation of the same frequency, the characteristics of said pulse train being such that at least part of the frequency spectrum of said radio frequency energy corresponds to at least part of the range of resonance frequencies for said given species within said at least part of said localised volume, that the intervals between said pulses are short compared with the spin-spin relaxation times for at least some of the nuclei of said given species present in said sample, and that in said other parts of said sample there is a significant change between consecutive ones of said intervals in the average value of said magnetic field during one such interval;

receiving from said sample a signal resulting from said nuclear magnetic resonance, said signal containing, by virtue of the manner in which said resonance is caused to occur, substantially continuous wave components whose respective amplitudes are dependent on the amounts of relevant nuclei present in different regions of said localised volume distributed along said given direction;

subjecting said signal to coherent detection to produce at least one detected signal; and sampling said at least one detected signal during at least one interval between said pulses for each of a series of consecutive equal sub-intervals of that interval, the sampling frequency being sufficiently high to enable information regarding said respective amplitudes to be derived by subjecting the data obtained by means of said sampling to appropriate processing involving Fourier transformation.

2. A method according to claim 1, in which said sampling involves deriving the integrated value of said at least one detected signal over each of said sub-intervals.

3. A method according to claim 1, in which said sampling is carried out over a series of consecutive intervals between said pulses and the average of the samples for each set of corresponding sub-intervals is separately derived, the averaging being effected over an integral number of periods of the systematic variations of said varying component of said magnetic field.

4. A method according to claim 1, in which said sampling is carried out over a series of consecutive intervals between said pulses and the average value of the samples for each set of corresponding sub-intervals is separately derived, the averaging being effected over a number of periods of the systematic variations of said varying component of said magnetic field which is much larger than unity.

5. A method according to claim 1, further comprising deriving information regarding said respective amplitudes by subjecting said data to processing involving Fourier transformation.

6. A method according to claim 5, in which said Fourier transformation is carried out after said data have been so adjusted as to reduce the significance of the values of those samples relating to the earlier part of an interval between said pulses relative to the values of those samples relating to the later part of an interval between said pulses.

7. A method according to claim 1, in which said localised volume approximates to a straight line.

8. A method according to claim 1, in which said localised volume approximates to a plane.

* * * * *

UNITED STATES PATENT AND TRADEMARK OFFICE
CERTIFICATE OF CORRECTION

PATENT NO. : 4,184,110
DATED : January 15, 1980
INVENTOR(S) : Waldo S. HINSHAW

It is certified that error appears in the above—identified patent and that said Letters Patent is hereby corrected as shown below:

Column 2, line 8, before "characteristics" insert --the--

Column 2, line 12, before "localised" insert --the--

Column 4, line 47, change "directions" to --direction--

Column 5, line 42, change "sets" to --set--

Column 5, line 47, after "Z=0" insert --and--

Column 5, line 57, after "coil" insert --set--

Signed and Sealed this

Eighth Day of July 1980

[SEAL]

Attest:

SIDNEY A. DIAMOND

Attesting Officer   Commissioner of Patents and Trademarks